United States Patent
Costello et al.

(10) Patent No.: US 9,733,357 B2
(45) Date of Patent: Aug. 15, 2017

(54) INFRARED PROXIMITY SENSOR PACKAGE WITH IMPROVED CROSSTALK ISOLATION

(75) Inventors: James Costello, Singapore (SG); Wee Sin Tan, Singapore (SG)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 1368 days.

(21) Appl. No.: 12/623,767

(22) Filed: Nov. 23, 2009

(65) Prior Publication Data

US 2011/0121181 A1    May 26, 2011

(51) Int. Cl.
*G01J 5/00* (2006.01)
*G01S 17/02* (2006.01)
*G01S 7/481* (2006.01)
*H03K 17/945* (2006.01)

(52) U.S. Cl.
CPC .......... *G01S 17/026* (2013.01); *G01S 7/4813* (2013.01); *H03K 17/945* (2013.01); *H01L 2224/48091* (2013.01); *H01L 2224/48247* (2013.01); *Y10T 29/49002* (2015.01)

(58) Field of Classification Search
USPC ...................................................... 250/338.4
See application file for complete search history.

(56) References Cited

U.S. PATENT DOCUMENTS

| | | |
|---|---|---|
| 5,155,777 A | 10/1992 | Angelopoulos et al. |
| 5,367,393 A | 11/1994 | Ohara et al. |
| 5,567,953 A | 10/1996 | Horinouchi et al. |
| 5,675,143 A | 10/1997 | Heimlicher |
| 5,760,390 A | 6/1998 | Vezzalini et al. |
| 5,811,797 A | 9/1998 | Kobachi et al. |
| 6,064,062 A | 5/2000 | Bohn |

(Continued)

FOREIGN PATENT DOCUMENTS

| | | |
|---|---|---|
| EP | 1455564 | 9/2004 |
| EP | 2019293 | 6/2008 |

(Continued)

OTHER PUBLICATIONS

"Agilent HSDL-D100 Miniature Surface-Mount Proximity Sensor Data Sheet", In current form on Dec. 21, 2007.

(Continued)

*Primary Examiner* — David Porta
*Assistant Examiner* — Shun Lee
(74) *Attorney, Agent, or Firm* — Sheridan Ross P.C.

(57) ABSTRACT

Disclosed are various embodiments of an infrared proximity sensor package comprising an infrared transmitter die, an infrared receiver die, a housing comprising sidewalls, a first recess, a second recess, a partitioning divider disposed between the first and second recesses, and an overlying shield comprising an infrared-absorbing material. The transmitter die is positioned in the first recess, and the receiver die is positioned within the second recess. The partitioning divider comprises liquid crystal polymer (LCP) such that the partitioning divider and the infrared-absorbing material of the shield cooperate together to substantially attenuate and absorb undesired infrared light that might otherwise become internally-reflected within the housing or incident upon the receiver as a false proximity or object detection signal.

23 Claims, 7 Drawing Sheets

(56) References Cited

U.S. PATENT DOCUMENTS

| | | | |
|---|---|---|---|
| 6,135,816 A | 10/2000 | Mashiyama et al. | |
| 6,180,881 B1 | 1/2001 | Isaak | |
| 6,364,706 B1 | 4/2002 | Ando et al. | |
| 6,572,410 B1 | 6/2003 | Volstorf et al. | |
| 6,635,955 B2 | 10/2003 | Scheidle | |
| 6,674,653 B1 | 1/2004 | Valentine | |
| 6,677,934 B1 | 1/2004 | Blanchard | |
| 6,740,862 B2 | 5/2004 | Paritsky et al. | |
| 6,771,671 B1 | 8/2004 | Fields et al. | |
| 6,855,933 B2 | 2/2005 | Stone et al. | |
| 6,885,300 B1 | 4/2005 | Johnston et al. | |
| 7,026,710 B2 | 4/2006 | Coyle et al. | |
| 7,109,465 B2 | 9/2006 | Kok et al. | |
| 7,172,126 B2 | 2/2007 | Schmidt et al. | |
| 7,229,295 B2 | 6/2007 | Ice et al. | |
| 7,256,483 B2 | 8/2007 | Eppler et al. | |
| 7,258,264 B2 | 8/2007 | Ice et al. | |
| 7,277,012 B2 | 10/2007 | Johnston et al. | |
| 7,289,142 B2 | 10/2007 | Silverbrook | |
| 7,348,536 B2 | 3/2008 | Bockel et al. | |
| 7,387,033 B2 | 6/2008 | Qing et al. | |
| 7,387,907 B2 | 6/2008 | Hsu et al. | |
| 7,427,806 B2 | 9/2008 | Arndt et al. | |
| 7,485,818 B2 | 2/2009 | Chou | |
| 7,510,888 B2 | 3/2009 | Guenther et al. | |
| 7,514,666 B2 | 4/2009 | Yee et al. | |
| 7,582,513 B2 | 9/2009 | Kroeninger et al. | |
| 7,675,132 B2 | 3/2010 | Waitl et al. | |
| 7,755,029 B2 | 7/2010 | Tang et al. | |
| 7,767,485 B2 | 8/2010 | Ogawa et al. | |
| 7,851,246 B2 | 12/2010 | Camacho | |
| 8,026,472 B2 | 9/2011 | Arnold | |
| 8,031,174 B2 | 10/2011 | Hamblin et al. | |
| 8,097,852 B2 | 1/2012 | Yao | |
| 8,143,608 B2 | 3/2012 | Yao et al. | |
| 8,207,517 B2 | 6/2012 | Wang et al. | |
| 8,275,922 B2 | 9/2012 | Barrett et al. | |
| 8,420,999 B2 | 4/2013 | Costello et al. | |
| 8,575,537 B2 | 11/2013 | Yao et al. | |
| 2002/0172472 A1 | 11/2002 | Nelson et al. | |
| 2004/0065894 A1 | 4/2004 | Hashimoto et al. | |
| 2005/0088900 A1 | 4/2005 | Chan | |
| 2005/0110157 A1 | 5/2005 | Sherrer et al. | |
| 2005/0199786 A1 | 9/2005 | Yoshida et al. | |
| 2006/0016994 A1 | 1/2006 | Basoor et al. | |
| 2006/0017069 A1 | 1/2006 | Bergmann | |
| 2006/0022212 A1 | 2/2006 | Waitl et al. | |
| 2006/0022215 A1 | 2/2006 | Arndt et al. | |
| 2006/0045530 A1 | 3/2006 | Lim et al. | |
| 2006/0049533 A1 | 3/2006 | Kamoshita | |
| 2006/0118807 A1 | 6/2006 | Ives et al. | |
| 2007/0045524 A1 | 3/2007 | Rains et al. | |
| 2007/0072321 A1 | 3/2007 | Sherrer et al. | |
| 2007/0085157 A1* | 4/2007 | Fadell et al. | 257/428 |
| 2007/0246646 A1 | 10/2007 | Lum et al. | |
| 2008/0006762 A1 | 1/2008 | Fadell et al. | |
| 2008/0011939 A1 | 1/2008 | Yee et al. | |
| 2008/0011940 A1 | 1/2008 | Zhang et al. | |
| 2008/0012033 A1 | 1/2008 | Arndt | |
| 2008/0030878 A1 | 2/2008 | Saxena et al. | |
| 2008/0049210 A1 | 2/2008 | Takaoka | |
| 2008/0116379 A1 | 5/2008 | Teder | |
| 2008/0118241 A1 | 5/2008 | TeKolste et al. | |
| 2008/0165115 A1 | 7/2008 | Herz et al. | |
| 2008/0173790 A1 | 7/2008 | Cheng et al. | |
| 2008/0173963 A1 | 7/2008 | Hsu et al. | |
| 2008/0179503 A1 | 7/2008 | Camargo et al. | |
| 2008/0197376 A1 | 8/2008 | Bert et al. | |
| 2008/0223934 A1* | 9/2008 | Havens et al. | 235/462.42 |
| 2008/0265266 A1 | 10/2008 | Bogner et al. | |
| 2008/0296478 A1 | 12/2008 | Hemoult | |
| 2008/0308738 A1 | 12/2008 | Li et al. | |
| 2008/0308917 A1 | 12/2008 | Pressel et al. | |
| 2009/0027652 A1 | 1/2009 | Chang et al. | |
| 2009/0057799 A1 | 3/2009 | Chan et al. | |
| 2009/0101804 A1 | 4/2009 | Le | |
| 2009/0129783 A1 | 5/2009 | Or et al. | |
| 2009/0159900 A1 | 6/2009 | Basoor | |
| 2009/0168088 A1 | 7/2009 | Rosenblatt | |
| 2009/0267173 A1 | 10/2009 | Takahashi et al. | |
| 2010/0030039 A1 | 2/2010 | Lamego et al. | |
| 2010/0171027 A1 | 7/2010 | Yun | |
| 2010/0224801 A1 | 9/2010 | Wang et al. | |
| 2010/0246771 A1 | 9/2010 | Hawver et al. | |
| 2010/0282951 A1 | 11/2010 | Costello et al. | |
| 2010/0327164 A1 | 12/2010 | Costello et al. | |
| 2011/0024627 A1 | 2/2011 | Yao | |
| 2011/0057102 A1 | 3/2011 | Yao | |
| 2011/0057104 A1 | 3/2011 | Yao et al. | |
| 2011/0057129 A1 | 3/2011 | Yao | |
| 2011/0121181 A1 | 5/2011 | Costello | |
| 2011/0204233 A1 | 8/2011 | Costello et al. | |
| 2011/0297831 A1 | 12/2011 | Yao et al. | |
| 2012/0070145 A1 | 3/2012 | Wong et al. | |
| 2012/0160994 A1 | 6/2012 | Costello et al. | |

FOREIGN PATENT DOCUMENTS

| | | |
|---|---|---|
| GB | 2486000 | 6/2012 |
| JP | 63308973 | 12/1988 |
| JP | 2006-114737 | 4/2006 |
| JP | 2006-261380 | 9/2006 |
| JP | 2008-181097 | 8/2008 |
| JP | 2008-265187 | 8/2008 |
| JP | 2009-137528 | 6/2009 |
| WO | WO 2006045531 A1 * | 5/2006 |
| WO | WO 2008/078806 | 7/2008 |
| WO | WO-2009/072786 | 6/2009 |
| WO | WO-2012068213 | 5/2012 |

OTHER PUBLICATIONS

Avago Technologies, "ADPS-9005 Miniature Surface-Mount Ambient Light Photo Sensor", Jan. 2007.

Avago Technologies, "ADPS-9101—Integrated Reflective Sensor", Data Sheet 2007.

Avago Technologies, "ADPS-9700 Signal Conditioning IC for Optical Proximity Sensors", Jan. 4, 2008.

Avago Technologies, "HSDL-9100—Surface-Mount Proximity Sensor", Data Sheet 2006.

Avago Technologies, "Integrated Ambient Light and Proximity Sensor Prelim Datasheet", ADPS-9800 Mar. 2, 2009.

Avago Technologies, "Integrated Optical Proximity Sensors Prelim Datasheet", ADPS-9120 Feb. 25, 2009.

AZ Optics, "Device Debuts as the World's Best-Performing Integrated Light/Proximity Sensor", Nov. 11, 2008.

Costello, et al., "U.S. Appl. No. 12/495,739", Optical Proximity Sensor Package with Molded Infrared Light Rejection Barrier and Infrared Pass Components Jun. 30, 2009.

IDES—The Plastic Web, "Si Photo Diode Chip", Dec. 19, 2007.

Ishihara, et al., "A Dual Face Package Using a Post with Wire Components: Novel Structure for PoP Wafer Level CSP and Compact Image Sensor Package", Electronic Components and Technology Conference 2008 , 1093-1098.

Khamal, Ibrahim, "Infra-Red Proximity Sensor (II)", Apr. 4, 2008.

Nitto Denko Corporation, "Technical Data Sheet", NT-8506 2001.

Nitto Denko Corporation, "Technical Data Sheet", NT-MB-IRL3801 2008.

Penchem Technologies Data Sheet, "Pemchem OP 580", IR Filter Optoelectronic Epoxy Apr. 2009.

Penchem Technologies Data Sheet, "Penchem OP 579", IR Pass Optoelectronic Epoxy Apr. 2009.

Tan, et al., "U.S. Appl. No. 12/623,767", Infrared Proximity Sensor Package with Improved Crosstalk Isolation, filed Nov. 23, 2009, 30 pages.

Tyntek, "Data Sheet for AlGaAs/GaAs Infrared Chip", TK116IRA Nov. 2006.

Tyntek, "Data Sheet for AlGaAs/GaAs Infrared Chip", TK 114IRA Mar. 2004.

(56) References Cited

OTHER PUBLICATIONS

Tyntek, "Data Sheet for Si Photo-diode Chip", TK 043PD Jun. 2004.
Xydar, "G-930—Solvay Advanced Polymers—Liquid Crystal Polyer Data Sheet", reproduced from website at www.ides.com/grades/ds/E22219.htm on Dec. 17, 2007.
"A 1/3" Format Image Sensor With Refractory Metal Light Shield For Color Video Applications," Losee et al. Solid State Circuits, 1989. Digest of Technical Papers, 36$^{th}$ ISSCC. IEEE International vol., Issue 15-17 Feb. 1989 pp. 90-91 10.1109/ISSCC 1989 48194.
"ADPS-9900 and ADPS-9901 Digital Proximity and Ambient Light Sensor", Mar. 23, 2011.
Avago Technologies, "Avago Technologies Announces Ultra-Thin Integrated Ambient Light and Proximity Sensor Module for Use in Mobile Phones", *Wireless Design and Development* Nov. 27, 2009.
Avago Technologies, , "Integrated Optical Proximity Sensors", *ADPS 9120, Data Sheet* Mar. 3, 2009.
"A4 Masking Sheet—A4 Masking Sheet", Downloaded from website: <http://www.stix2.com.au/a4-masking-sheet-13/a4-masking-sheet.html> 2012, Product Description 2012.
"Altera 40/100 Gigabit Ethernet", *Altera Corporation Product Sheet* Copyright 1995-2012, 3 pages 2012.
"Altera's 10-Gbps Ethernet (XAUI) Solution", *Altera Corporation Product Sheet*, Copyright 1995-2012, 2 pages 2012.
"Nordson Ink-Dot I.D. System", *Nordson Corporation Product Sheet 2012*, 2 pages 2012.
Morgavi, Paul , "Panasonic Print Head Technology and Market Applications", *IMI Europe, Digital Printing Conferences 2007, Presentation*, Nov. 7 to 9, 2007, 24 pages 2007.

\* cited by examiner

INFRARED PROXIMITY SENSOR PACKAGE WITH IMPROVED CROSSTALK ISOLATION

FIELD OF THE INVENTION

Various embodiments relate to the field of infrared proximity sensor packages generally, devices which employ such packages, and methods of making and using same.

BACKGROUND

Many optical proximity sensors known in the art are made using an infrared LED and an infrared light detector. Light from the LED is reflected from an object to be detected back to the detector, and the strength of the received signal is proportional to the distance of the object to be detected from the sensor. Such optical proximity sensors find applications in many portable devices such as mobile telephones, smart phones and PDAs, and can be used, by way of example, to activate or de-activate touch screens.

Examples of optical proximity sensors include the AVAGO TECHNOLOGIES™ APDS-9120 and QPDS-9120 optical proximity sensor packages, which contain an integrated high efficiency infrared emitter and a detector or photodiode housed in a small form factor surface mount device (SMD) package. In the APDS-9120 optical proximity sensor package, as in many other proximity sensor packages manufactured by companies other than AVAGO TECHNOLOGIES™ such as SHARP™, ROHM™ and VISHAY™, an infrared transmitter die must be placed in very close proximity to an infrared receiver die (e.g., mere millimeters apart in the same package).

One significant issue in the design of optical proximity sensors is optical crosstalk, where stray light from the LED falls on the detector and can generate an undesired false signal mimicking a true proximity or object detection signal. Transmitted or received infrared light rays tend to bounce around or reflect internally within such packages, and also to generate scattered, stray reflected or otherwise undesired infrared light rays that bounce off of cover windows or other external objects, resulting in undesired infrared signal crosstalk occurring in respect of both the transmitter and the receiver.

If optical cross talk is too high it can have a detrimental effect on the overall sensing distance the device is capable of achieving, and hence limits device performance. Further exacerbating the foregoing problems is the distinct tendency of infrared radiation to pass substantially or barely unattenuated through many different materials, such as printed circuit boards, many plastics and polymers, and even thin ceramic materials. As the demand for ever smaller proximity sensor packages increases, the problem of eliminating or reducing such infrared signal crosstalk becomes more urgent.

What is needed is an infrared proximity sensor package that features reduced infrared signal crosstalk, but that is inexpensive and easy to manufacture.

SUMMARY

In one embodiment, there is provided an infrared proximity sensor package comprising an infrared transmitter, an infrared receiver, a shield disposed atop the package and having first and second apertures disposed therethrough and positioned over the infrared transmitter and the infrared receiver, respectively, such that infrared light emitted by the transmitter passes through the first aperture and infrared light reflected from an object to be detected passes through the second aperture for detection by the receiver, the shield comprising an infrared-absorbing material disposed on at least a top surface thereof, a housing comprising sidewalls, a first recess, a second recess and a partitioning divider disposed between the first and second recesses, where the transmitter is disposed in the first recess, the receiver is disposed in the second recess, and the partitioning divider comprises liquid crystal polymer (LCP). The partitioning divider and the infrared-absorbing material of the shield cooperate together to substantially attenuate and absorb undesired infrared light that may otherwise become internally-reflected within the housing or incident upon the receiver as a false signal.

In another embodiment, there is provided a method of making an infrared proximity sensor package comprising providing an infrared transmitter, providing an infrared receiver, providing a shield disposed atop the package and having first and second apertures disposed therethrough and positioned over the infrared transmitter and the infrared receiver, respectively, such that infrared light emitted by the transmitter passes through the first aperture and infrared light reflected from an object to be detected passes through the second aperture for detection by the receiver, the shield comprising an infrared-absorbing material disposed at least on a top surface thereof, providing a housing comprising sidewalls, a first recess, a second recess and a partitioning divider disposed between the first and second recesses, positioning the transmitter within the first recess, and positioning the receiver within the second recess. The partitioning divider comprises liquid crystal polymer (LCP) such that the partitioning divider and the infrared-absorbing material of the shield cooperate together to substantially attenuate and absorb undesired infrared light that may otherwise become internally-reflected within the housing or incident upon the receiver as a false signal.

In other embodiments, there are provided methods of using and making the foregoing infrared proximity sensor package. Numerous other embodiments are also contemplated.

BRIEF DESCRIPTION OF THE DRAWINGS

The drawings are not necessarily to scale. Like numbers refer to like parts or steps throughout the drawings.

DETAILED DESCRIPTIONS OF SOME PREFERRED EMBODIMENTS

In the following Detailed Description, reference is made to the accompanying drawings, which form a part hereof, and in which are illustrated specific embodiments according to which the invention may be practiced. In this regard, directional terminology, such as "top," "bottom," "atop," "beneath," "forward," "backward," "side," "front," "back," etc., is used with reference to the orientation of the Figures being described. Because the components of various embodiments of the invention may be positioned in a number of different orientations, the directional terminology is used for purposes of illustration and is in no way limiting. It is to be understood that other embodiments may be utilized, and that structural or logical changes may be made without departing from the scope of the present invention. The following Detailed Description, therefore, is not to be taken in a limiting sense, and the scope of the present invention is defined by the appended claims.

Figure 1:
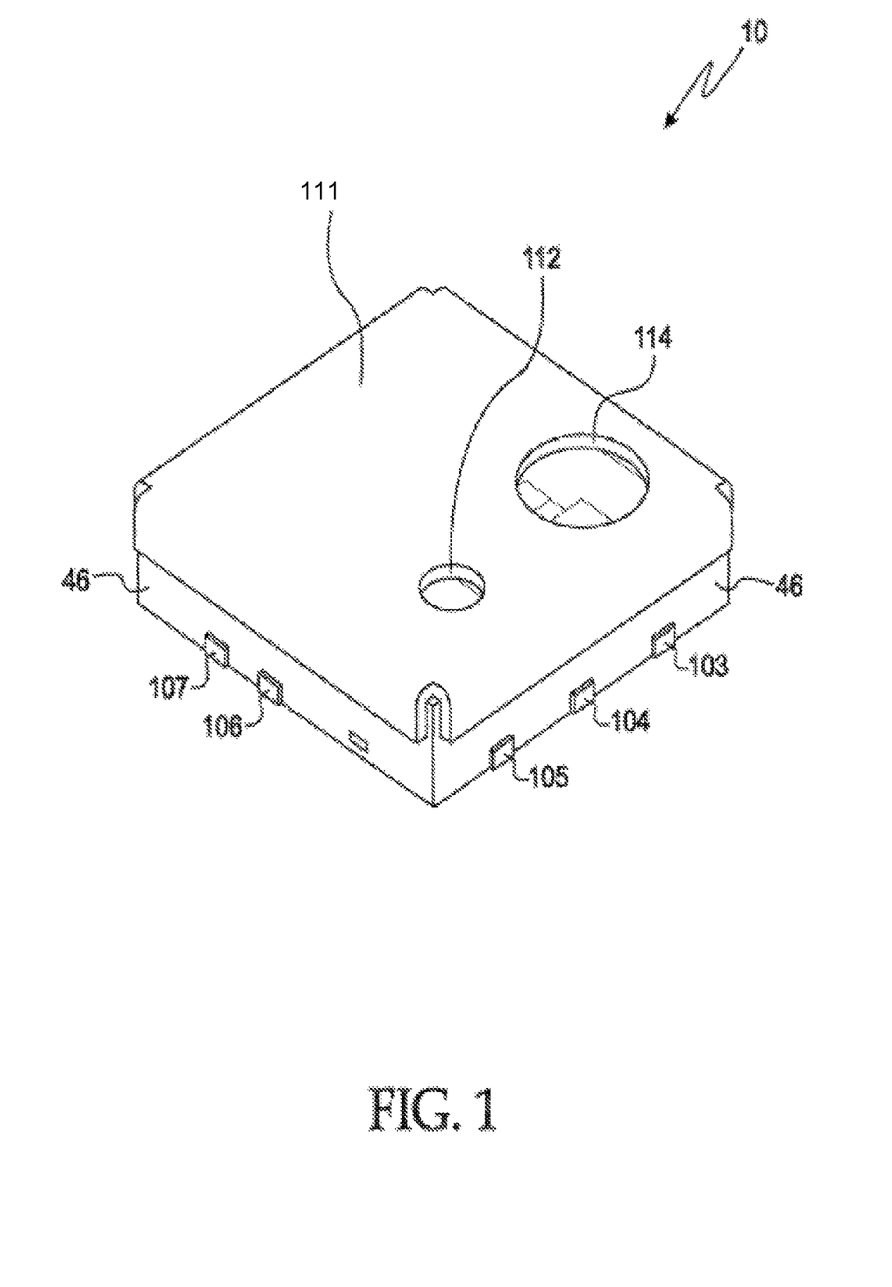
FIG. 1 shows a top perspective view of one embodiment of an infrared proximity sensor package.

FIG. 1 is a top perspective view of one embodiment of infrared proximity sensor package 10. In one embodiment, shield 111 is disposed atop package 10 and housing 46 and has first and second apertures 112 and 114 disposed therethrough and positioned over infrared transmitter 70 (see FIG. 2) and infrared receiver 60 (see FIG. 2), respectively, such that infrared light emitted by transmitter 70 passes through first aperture 112 and infrared light reflected from an object to be detected passes through second aperture 114 for detection by receiver 60.

Figure 2:
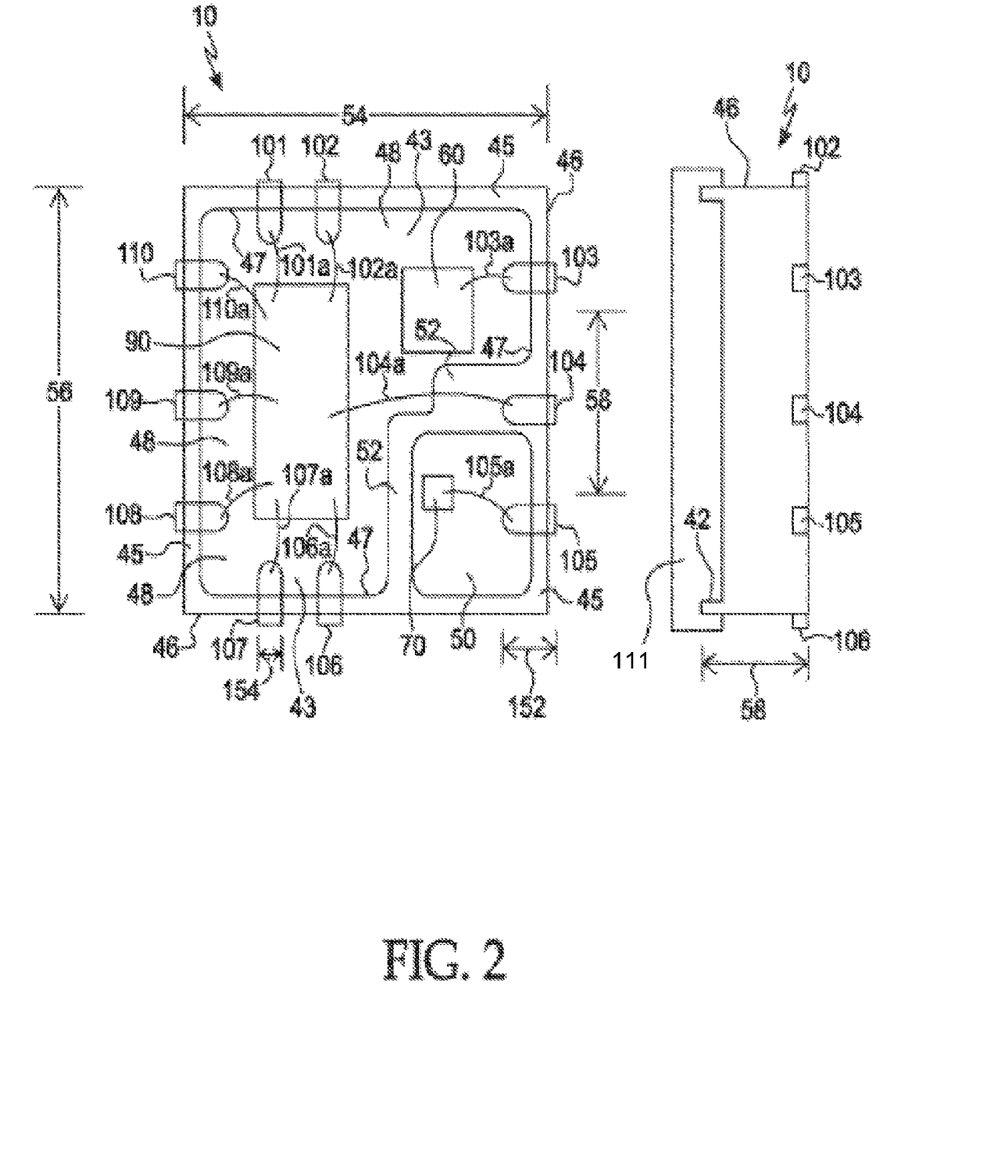
FIG. 2 shows a top plan view of the package of FIG. 1 with no shield disposed thereover.
Figure 3:
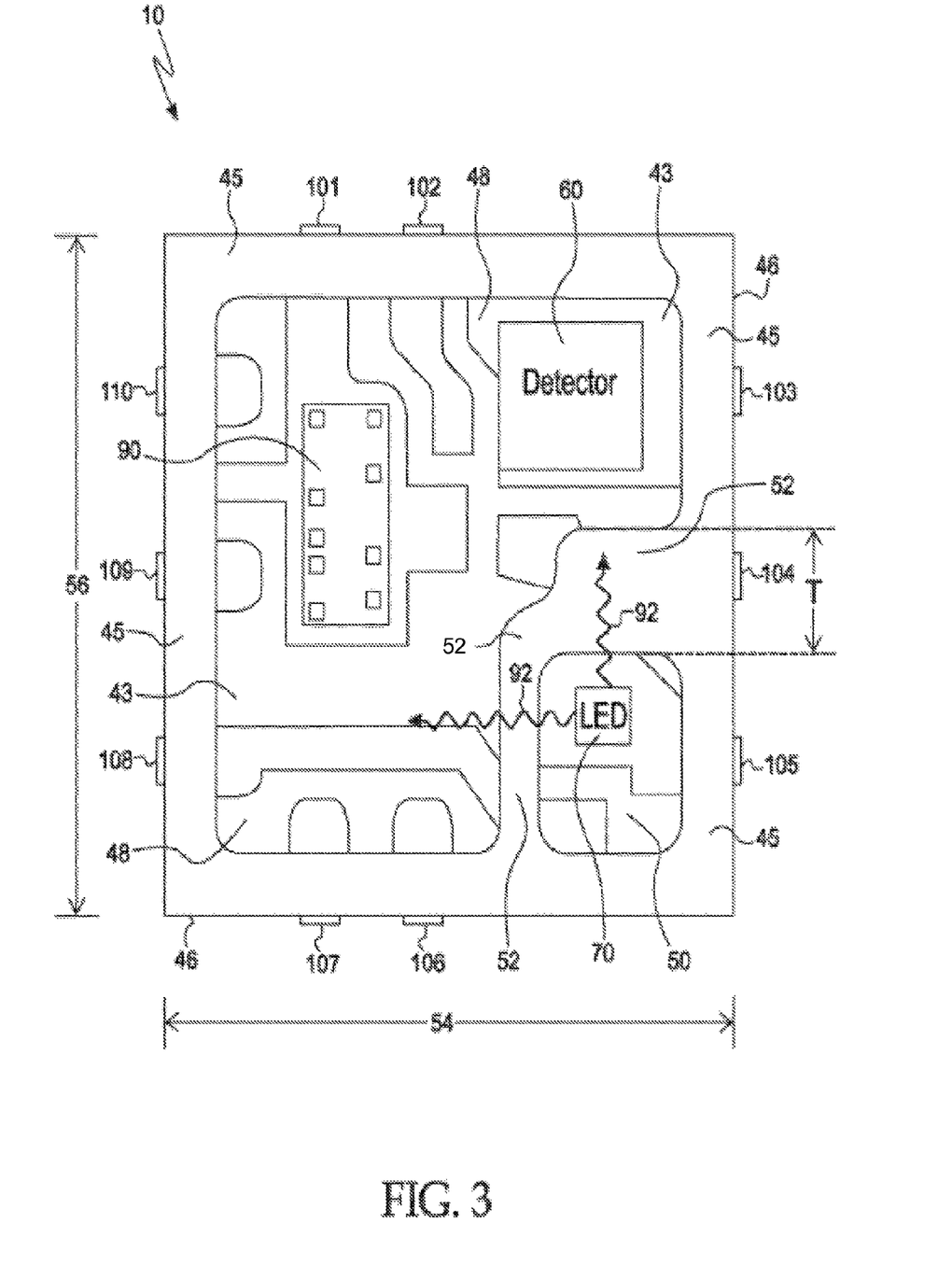
FIG. 3 shows another top plan view of the package of FIG. 2.

FIGS. 2 and 3 shows top plan views of optical proximity sensor 10 with shield 111 removed therefrom. As shown in FIGS. 2 and 3, transmitter 70 is positioned within first recess 50. Receiver 60 is positioned within second recess 48. According to one embodiment, receiver 60 and transmitter 70 are semiconductor dice. Partitioning divider 52 of housing 46 comprises liquid crystal polymer (LCP) such that infrared light internally-reflected within housing 46 and between first and second recesses 50 and 48, such as, by way of example in the direction of partitioning divider 52, is substantially attenuated or absorbed by the LCP contained therein, more about which we say below.

Figure 4:
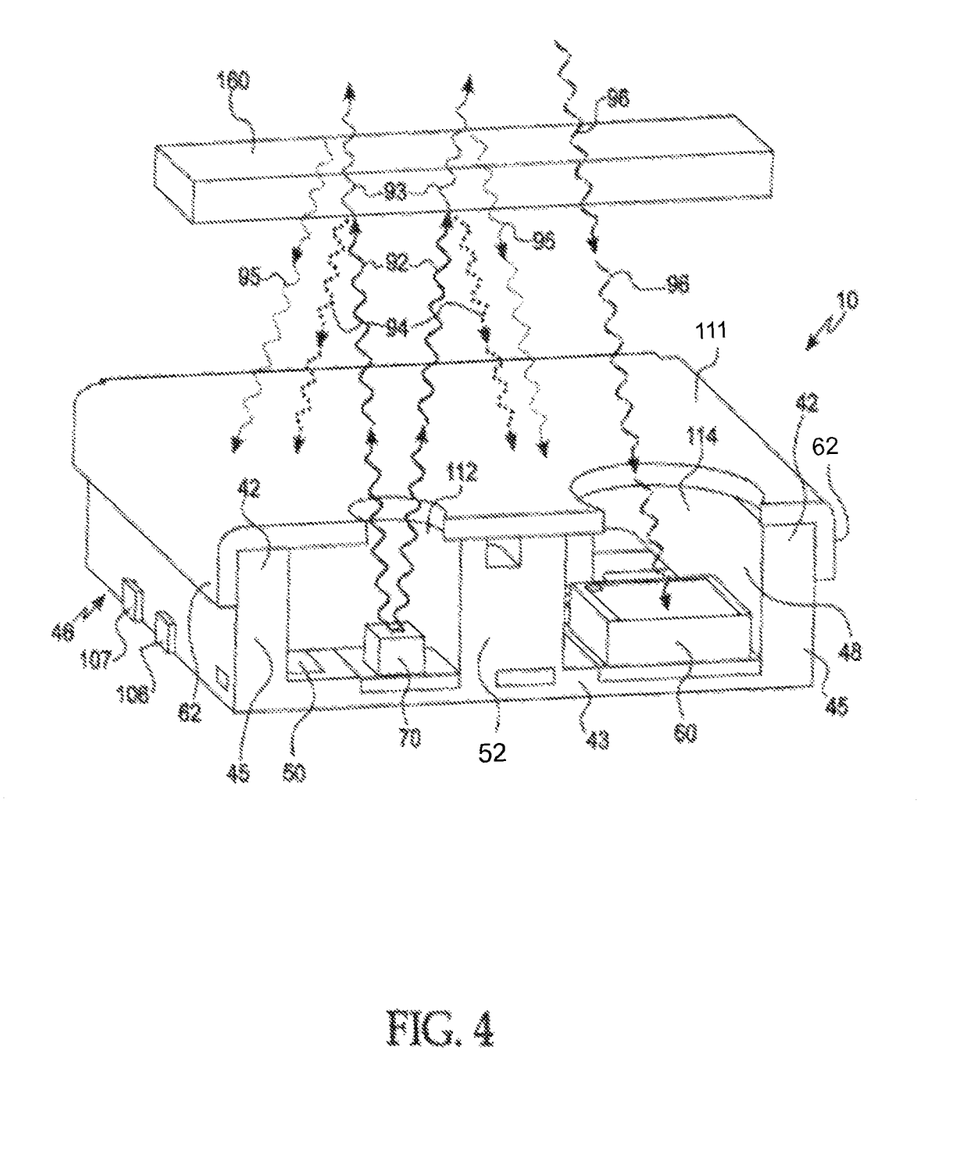
FIG. 4 shows a side perspective partial cross-sectional view of the packages of FIGS. 1 through 3.

As shown in FIGS. 2, 3 and 4, housing 46 comprises sidewalls 45 having inner surfaces 47 and being disposed between first recess 50 and second recess 48 which extend vertically between lower and upper housing portions 43 and 42 thereof, respectively. First and second recesses 50 and 48 are separated by partitioning divider 52, which in one embodiment is integrally molded to the remainder of housing 46.

In the embodiment of housing 46 shown in FIG. 2, distance 58 between infrared transmitter 70 and infrared receiver 60 most preferably ranges between about 2 mm and about 8 mm, and housing width 54 most preferably ranges between about 2 mm and about 8 mm. In the embodiment of housing 46 shown in FIG. 2, partitioning divider thickness T most preferably exceeds about 0.4 mm, about 0.5 mm, about 0.6 mm, or about 0.7 mm.

According to one embodiment, but not shown in the Figures, first and second lenses may be provided that are configured to fit, respectively, over, within, adjacent to, or beneath first aperture 112 and second aperture 114 such that infrared light transmitted upwardly by transmitter 70 is collimated and focused in an upward predetermined direction by the first lens, and such that infrared light reflected from an object to be detected and arriving at the second lens from a downward direction is collimated and focused towards receiver 60. Various types of lens configurations are contemplated, such as separate first and second lenses, concave lenses, convex lenses, compound lenses, fresnel lenses, and other types of lenses known to those skilled in the art capable of being configured to collimate and/or focus infrared light.

In one embodiment, the first and second lenses are formed of a suitable thermoset epoxy material, which may be poured atop transmitter 70 into first recess 50 and atop receiver 60 into second recess 48, shaped, and then cured at a suitable elevated temperature until sufficiently hardened. In another embodiment, the first and second lenses are integrally molded in an infrared-pass material molded over at least some of the components disposed within housing 46. In either embodiment, the lenses may be tinted black to permit infrared light transmittance but little or no transmittance of light having wavelengths below about 750 nm or about 700 nm, and thus can be configured to act as low-cut filters.

Referring to FIGS. 2 and 3, in some embodiments receiver 60 is a photodiode chip manufactured by TYNTEK having model number TK-043 PD. Note that receiver 60 may be any one of a PIN diode, a photo-diode and a phototransistor. Other types of dice and receivers known to those skilled in the art are also contemplated for receiver 60. Continuing to refer to FIG. 2, in some embodiments transmitter 70 is P/N mesa type AlGaAs/GaAs infrared chip, also manufactured by TYNTEK, having model number TK 114IRA. Other types of dice and emitters known to those skilled in the art are also contemplated for transmitter 70.

In some embodiments, transmitter 70 and receiver 60 are configured for operation within a bandwidth ranging between about 800 nm and about 1100 nm, or between about 850 nm and about 900 nm. 11. When operably disposed within housing 46, an edge of transmitter 70 closest to an edge of receiver 60 is optimally less than about 2 mm so that package 10 may be made as small as practicable: Package 10 illustrated in FIGS. 1, 2, 3 and 4 is particularly efficacious owing to its overall small size. For example, width 54 may be only about 4.5 mm, length 56 may be only about 4.5 mm, and distance 58 may be only about 1.2 mm.

As discussed above, transmitter 70 is disposed within first recess or cavity 50, and is separated from second cavity 48 by partitioning divider 52. Receiver 60 is disposed in second cavity 48 along with processor or ASIC 90, which in a preferred embodiment is operably connected to transmitter 70 and receiver 60 by means of wirebonding (not shown in the Figures). In some embodiments, terminal pins 101 through 110 are also operably connected to processor 90, transmitter die 70 and receiver die 60, as the case may be, by wirebond connections (not shown in the Figures). Other means of establishing electrical connections between external devices and the various components of package 10 may also be employed, such as solder ball and bump techniques, ball grid array techniques, or other techniques such as forming conventional solder connections.

Note that infrared proximity sensor package 10 may further comprise a quad flat no lead (QFN) lead frame having infrared transmitter 70 secured to a first frame portion thereof, and infrared receiver die 60 secured to a second frame portion thereof (not shown in the Figures). Such a lead frame is preferably configured to fit beneath housing 46 and to engage lower lower portions 43 thereof.

Terminal pins 101, 102, 103, 104, 105, 106, 107, 108, 109, and 110 having approximate length 152 and width 154 are configured to permit electrical connection of package 10 to one or more electronic devices external thereto. Sensor package 10 may be incorporated into or operably connected to one or more of a portable electronic device, a hand-held portable electronic device, a stationary electronic device, a washing machine, a dryer, an exercise machine, an industrial control or switching device, a camera, a toy, a mobile telephone, a smart phone, a touchscreen, a cellular telephone, a portable music player, a remote control, a television, an air conditioning unit, a heating unit, an audio playback device, an audio recording device, an MP3 player, a laptop computer, a personal data assistant (PDA), a radio, a transceiver, a telephone, an appliance, an auto-volume adjustment circuit, and an open-phone detection circuit (such as may be employed in a clamshell-style mobile phone).

In still other embodiments of package 10, it is contemplated that dividing partition 52 have a thickness less than about 0.4 mm, package 10 have a width or a length less than about 5 mm, and/or a height less than at least one of about 3 mm, about 2 mm, and about 1.2 mm.

Referring now to FIGS. 1 through 4, housing 46 comprises upper housing portion 42, lower housing portion 43, sidewalls 45, first recess 50 and second recess 48. As previously described, first and second recesses 50 and 48 are separated by partitioning divider 52, which in a preferred embodiment is integrally molded to other portions of housing 46. In one embodiment, the entire housing is injection molded from LCP. In other embodiments, at least dividing partition 52 comprises LCP, and one or more of sidewalls 45, upper housing portion 42, and lower housing portion 43 comprises LCP. Less preferably, an admixture of LCP and a suitable polymer may be employed to form housing 46 or various portions thereof. Also less preferably, dividing partition 52 may be formed of LCP, while the remaining portions of housing 46 may be formed from plastic, a polymer, or a metal or metal alloy. In one embodiment, at least portions of a lead frame are moldably integrated into housing 46.

As mentioned above, dividing partition 52 and preferably other portions of hosing 46 are formed of LCP such that infrared light internally-reflected within the housing such as, by way of example, in the direction of dividing partition 52 and/or other portions of housing 46 is substantially attenuated or absorbed by the LCP contained therein. It has been discovered that undesired infrared light rays reflecting internally within sensor 10 can increase the amount of crosstalk incident on receiver 60 by saturating the potting compound used inside the package. See FIG. 3, for example, where some portion of direct infrared light rays 92 emitted by transmitter or LED 70 are illustrated as passing through partitioning divider 52 for potential detection by receiver or detector 60. The composition and thickness of partitioning divider 52 are formulated and configured to minimize the magnitude of such undesired direct infrared light rays passing through partitioning divider 52, and to prevent the unwanted propagation of internal reflections of such direct infrared light rays within cavity or recess 48.

Referring now to FIG. 4, there are shown infrared light rays 92 emitted by transmitter 70, which pass through first aperture 112 for incidence upon the underside of cover window 160. In some applications cover window 160 is provided as part of the portable or other type of electronic device in which proximity sensor 10 is housed and mounted. As illustrated in FIG. 4, portions of direct infrared light rays 92, which under optimal conditions would pass substantially unattenuated through cover window 160 for incidence upon and reflection from an object to be detected (not shown in the Figures), are instead converted at the bottom and top surfaces of cover window 160 into reflected 94, scattered, refracted 93 and/or 95, indirect or otherwise undesired downwardly-directed light rays which may be sensed by receiver 60 as false proximity or object detection signals.

The magnitude of these false and undesired infrared signals is reduced substantially by the combination of the infrared-absorbing properties of shield 111 and the LCP composition of at least portions of housing 46. Instead, the detection and reception of infrared light rays 96 reflected from the object to be detected is maximized, while the magnitude of undesired crosstalk is minimized.

Figure 5:
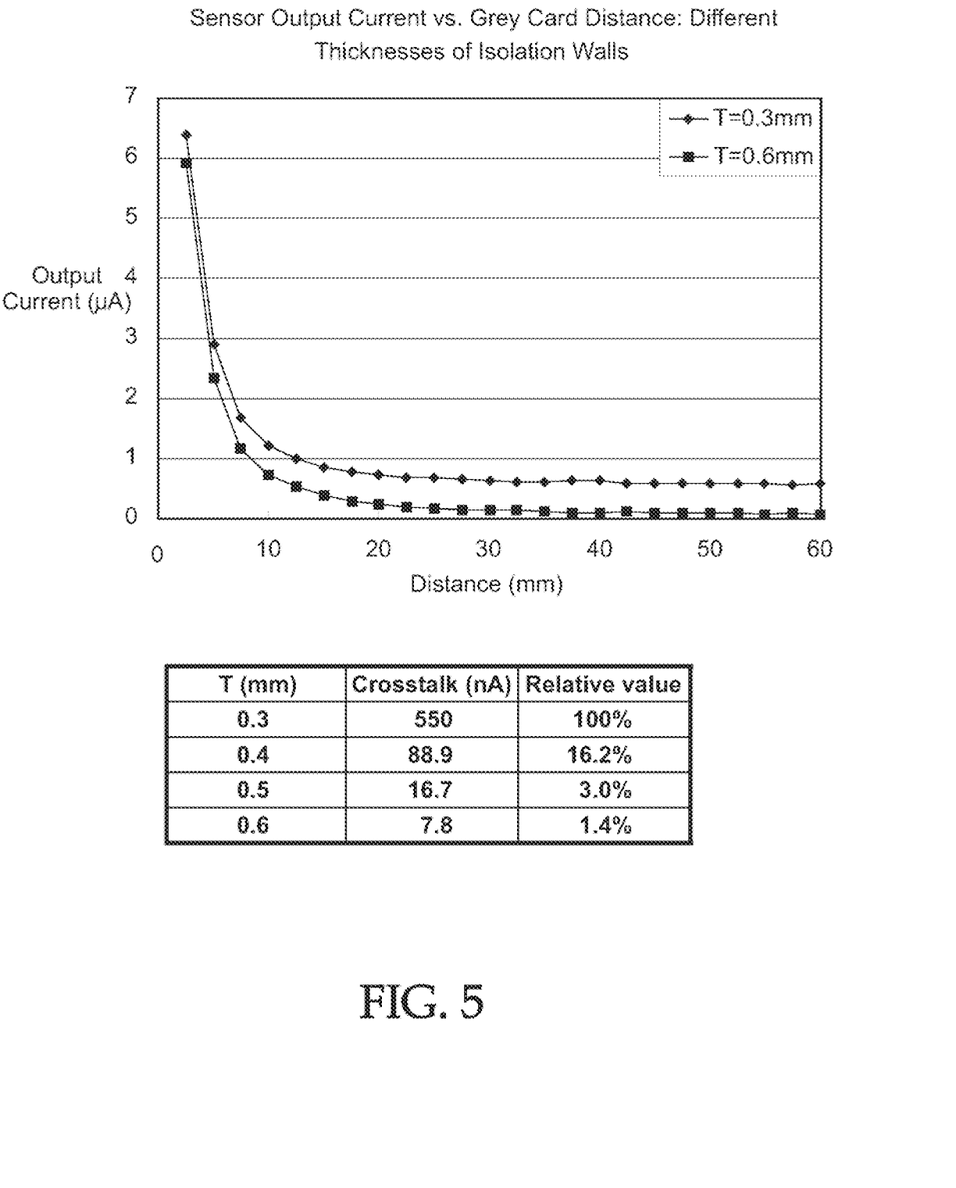
FIG. 5 illustrates crosstalk isolation results obtained according to one embodiment of an optical proximity sensor or package.

The unusual infrared radiation absorption and attenuation properties of LCP, and the thickness T of partitioning divider 52 employed in the housing are borne out by the comparative crosstalk measurements shown in FIG. 5. The graph and table of FIG. 5 show the results of crosstalk measurements made using infrared transmitters and receivers placed in adjoining first and second cavities separated by partitioning dividers 52 of different thicknesses. AVAGO TECHNOLOGIES™ APDS-9120 proximity sensor packages were adapted to provide housings having partitioning dividers 52 formed of different thicknesses T, and crosstalk was then measured. As illustrated by the results shown in the graph and table of FIG. 5, slight increases in the thickness T of LCP partitioning divider 52 are critical in reducing the amount of optical crosstalk between transmitter 70 and receiver 60. As shown in FIG. 5, at a thickness T of 0.6 mm optical crosstalk between transmitter 70 and receiver 60 is reduced by 98.6%.

LCPs having suitable compositions and properties for use in infrared proximity sensor housings may be obtained from suppliers such as SOLVAY ADVANCED POLYMERS™ located at 4500 McGinnis Ferry Road, Alpharetta, Ga. 3005-3914. One type of LCP manufactured by Solvay Advanced Polymers that has been demonstrated to be particularly efficacious for forming housings of the present invention is XYDAR G-930, which is an LCP plastic material with filler and 30% glass fiber reinforcement. XYDAR G-930 LCP is a glass reinforced injection molding grade polymer developed specifically for electronic applications utilizing surface mount technology, and features excellent moldability characteristics. XYDAR G-930 resin can fill very thin walls over long flow lengths with little or no flash, even at mold temperatures below 200° F. (93° C.). In addition, it has low warpage in molded products and exceptional weld line strength. Like many other LCPs, XYDAR G-930 exhibits high strength and stiffness (even at elevated temperatures), a low coefficient of thermal expansion, a high deflection temperature, inherent flame resistance, and strong resistance to most chemicals, weathering, and radiation. In addition to SOLVAY ADVANCED POLYMERS, other manufacturers of LCP include AMOCO PERFORMANCE PRODUCTS™ and HOECHST CELANESE CORPORATION.™ Formulations of LCP suitable for use in forming the housings of the present invention include, but are not limited to, those which are biphenol-based and napthaline-based.

LCPs are relatively inert. They resist stress cracking in the presence of most chemicals at elevated temperatures, including aromatic or halogenated hydrocarbons, strong acids, bases, ketones, and other aggressive industrial substances. Hydrolytic stability in boiling water is also good. Easy processibility of LCP resins may be attributed to their liquid-crystal molecular structure, which provides high melt flow and fast setup in molded parts. The physical properties of parts molded from LCP are generally not affected by minor variations in processing conditions, and thus post-curing requirements are generally not very rigorous.

To attenuate and absorb undesired reflected, internally reflected, externally reflected, stray or scattered infrared light rays, shield 111 comprises an infrared-absorbing material disposed on at least a top surface thereof. In one embodiment, shield 111 comprises a lip 62 and the combination of the shield 111 and lip 62 is formed of metal and is blackened or painted on at least top portions thereof to reduce the effects of undesired infrared light rays that are scattered or reflected from cover window 160. It has also been discovered that a close fit of shield 111 is important to prevent gaps from allowing undesired infrared light rays to penetrate to the package and eventually become incident upon receiver 60 in sensor package 10.

The infrared absorbing material of shield 111 may assume any number of different forms, such as black or dark paint, or indeed any other suitable type of dark coating applied to the top and/or side surfaces of shield 111. The infrared absorbing material of shield 111 may comprise LCP or any other suitable polymer or infrared-absorbing material. In one embodiment, shield 111 is formed or molded from such a material, and is not formed of metal.

Figure 6:
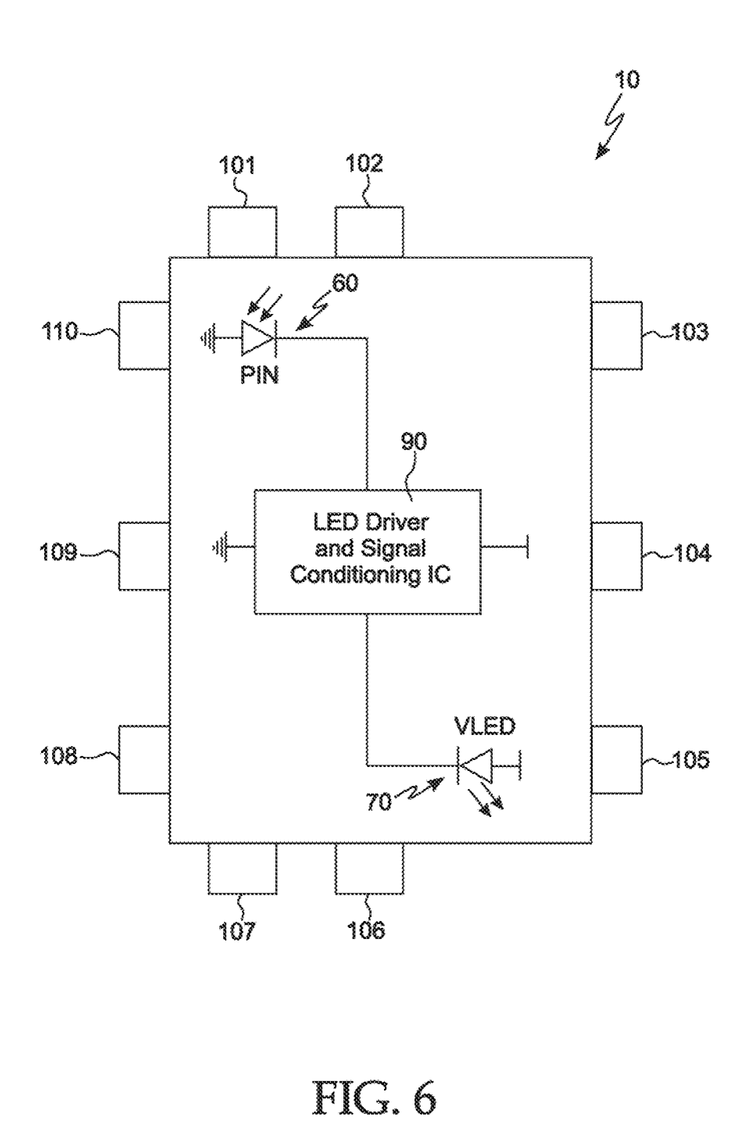
FIG. 6 shows a functional block diagram according to another embodiment of an infrared proximity sensor package.

FIG. 6 shows a functional block diagram according to one embodiment of infrared proximity sensor package 10, where processor or ASIC 90 is operably connected to PIN receiver 60 and VLED transmitter 70. Processor 90 preferably comprises transmitter driving circuitry, receiver detection circuitry and signal conditioning circuitry, and in preferred embodiments is an application specific integrated circuit (ASIC). Terminal pins 101, 102, 103, 104, 105, 106, 107, 108, 109, and/or 110 are operably connected to processor 90, transmitter 70 and receiver 60 by wirebonding or other suitable means known to those skilled in the art.

Figure 7:
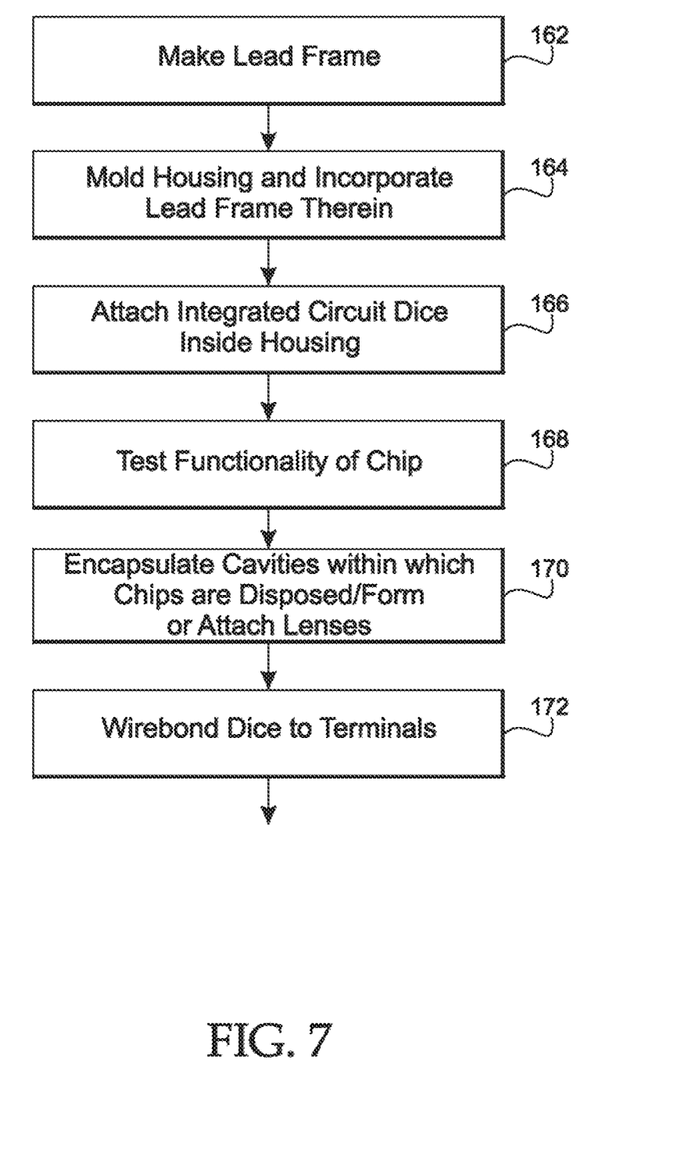
FIG. 7 shows various steps according to one embodiment of a method of making an infrared proximity sensor package.

In one embodiment, as shown in FIG. 7, there is provided a method of making infrared proximity sensor package 10 comprising providing shield 111 disposed atop package 10 and having first and second apertures 112 and 114 disposed therethrough and positioned over infrared transmitter 70 and infrared receiver 60, respectively. The infrared light emitted by transmitter 70 passes through first aperture 112 and infrared light reflected from an object to be detected passes through second aperture 114 for detection by receiver 60, shield 111 comprising an infrared-absorbing material disposed on at least a top surface thereof. Housing 46 is provided comprising sidewalls 45, first recess 50, second recess 48 and partitioning divider 52 disposed between first and second recesses 50 and 48. Transmitter 70 is positioned within first recess 50, and receiver 60 is positioned within second recess 48. Partitioning divider 52 comprises LCP such that partitioning divider 52 and infrared-absorbing shield 111 cooperate together to substantially attenuate and absorb infrared light that would otherwise be internally-reflected within housing 46 and detected by receiver 60 as a false signal.

Another example of such a method may comprise one or more of: making a lead frame (step 162); molding the housing and incorporating the lead frame therein (step 164); attaching the integrated circuit dice inside the housing (step 166); testing the functionality of the chip (step 168); encapsulating cavities within which chips are disposed and forming or attaching lenses (step 170); and wirebonding dice to terminals (step 172).

Such a method may further comprise any one or more of: (a) providing a lead frame configured to fit beneath housing 46 and engage lower portions 43 thereof, the lead frame comprising first and second frame portions; (b) attaching the lead frame to lower housing portion 43; (c) disposing transmitter 70 on the first frame portion and positioning transmitter 70 within first recess 50; (d) disposing receiver 60 on the second frame portion and positioning receiver 60 within second recess 48; (e) molding housing 46 or portions thereof from LCP; and/or (f) integrally molding at least portions of the lead frame into housing 46. Other methods of making or using package 10 or housing 46 are also contemplated, such as providing housing 46 or housing components made of a material other than LCP, or coating or laminating housing 46, housing components or shield 111 with LCP by laminating, coating, spin-coating, molding, injection molding or other means.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

Note further that included within the scope of the present invention are methods of making and having made the various components, devices and systems described herein.

While the primary use of the input device of the present invention is believed likely to be in the context of relatively small portable devices, it may also be of value in the context of larger devices, including, for example, keyboards associated with desktop computers or other less portable devices such as, by way of non-limiting example only, exercise equipment, industrial control panels, or household or other appliances.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

We claim:

1. An infrared proximity sensor package, comprising:
an infrared transmitter;
an infrared receiver;
a shield disposed atop the package and having first and second apertures disposed therethrough and positioned over the infrared transmitter and the infrared receiver, respectively, such that infrared light emitted by the transmitter passes through the first aperture and infrared light reflected from an object to be detected passes through the second aperture for detection by the receiver, the shield comprising an infrared-absorbing material disposed on at least a top surface thereof;
a housing comprising sidewalls, a first recess at least partially aligned with the first aperture of the shield, a second recess at least partially aligned with the second aperture, and a partitioning divider disposed between the first and second recesses, the partitioning divider comprising a first portion and second portion, the first portion being of a first thickness and the second portion being of a second thickness different from the first thickness, the first portion substantially separating the transmitter and receiver;
wherein the transmitter is disposed in the first recess, the receiver is disposed in the second recess, and the partitioning divider comprises liquid crystal polymer (LCP) such that the partitioning divider and the infrared-absorbing material of the shield cooperate together to substantially attenuate and absorb undesired infrared light that may otherwise become internally-reflected within the housing or incident upon the receiver as a false signal.

2. The infrared proximity sensor package of claim 1, wherein the thickness T of the partitioning divider exceeds about 0.4 mm such that at least about 90% of the infrared light internally-reflected within the housing is not detected by the receiver and is attenuated or absorbed by the shield and the LCP.

3. The infrared proximity sensor package of claim 1, wherein the thickness T of the partitioning divider exceeds about 0.5 mm such that at least about 95% of the infrared light internally-reflected within the housing is not detected by the receiver and is attenuated or absorbed by the shield and the LCP.

4. The infrared proximity sensor package of claim 1, wherein the thickness T of the partitioning divider exceeds about 0.6 mm such that at least about 97% of the infrared light internally-reflected within the housing is not detected by the receiver and is attenuated or absorbed by the shield and the LCP.

5. The infrared proximity sensor package of claim 1, wherein top and side surfaces of the shield are black.

6. The infrared proximity sensor package of claim 1, wherein the shield comprises an infrared-absorbing polymer.

7. The infrared proximity sensor package of claim 6, wherein the infrared-absorbing polymer comprises LCP.

8. The infrared proximity sensor package of claim 1, wherein the shield is a black coating.

9. The infrared proximity sensor package of claim 1, further comprising a lead frame configured to fit beneath the housing, the transmitter being disposed on a first frame portion thereof, the receiver being disposed on a second frame portion thereof such that the transmitter is positioned within the first recess and the receiver is positioned within the second recess, wherein at least a portion of the lead frame is moldably integrated into the housing such at the at least a portion of the leadframe is exposed in at least one of the first and second recess of the housing.

10. The infrared proximity sensor package of claim 1, wherein the sidewalls of the housing comprise LCP such that infrared light internally-reflected within the housing in the direction of the sidewalls is substantially attenuated or absorbed by the LCP contained therein.

11. The infrared proximity sensor package of claim 1, wherein the sidewalls and partitioning divider of the housing are molded from LCP to form the housing as a single unitary piece of LCP.

12. The infrared proximity sensor package of claim 1, further comprising a processor operably coupled to the transmitter and the receiver, the processor comprising transmitter driving circuitry, receiver detection circuitry and signal conditioning circuitry.

13. The infrared proximity sensor package of claim 1, wherein the transmitter comprises an infrared LED transmitter.

14. The infrared proximity sensor package of claim 1, wherein the receiver comprises at least one of a PIN diode, a photo-diode and a phototransistor.

15. The infrared proximity sensor package of claim 1, wherein at least one of the transmitter and the receiver is configured for operation within a bandwidth ranging between about 800 nm and about 1100 nm.

16. The infrared proximity sensor package of claim 1, wherein the sensor package is incorporated into an electronic device selected from the group consisting of a portable electronic device, a hand-held portable electronic device, a stationary electronic device, a washing machine, a dryer, an exercise machine, an industrial control or switching device, a camera, a toy, a mobile telephone, a cellular telephone, a portable music player, a remote control, a television, an air conditioning unit, a heating unit, an audio playback device, an audio recording device, an MP3 player, a laptop computer, a personal data assistant (PDA), a radio, and a transceiver.

17. The infrared proximity sensor package of claim 1, wherein the sensor package is incorporated into a telephone and operably connected to at least one of an auto-volume adjustment circuit and an open-phone detection circuit.

18. The infrared proximity sensor package of claim 1, further comprising a lens disposed over at least one of the transmitter and the receiver and within at least one of the first aperture and second aperture.

19. The infrared proximity sensor package of claim 18, wherein the lens is configured to act as a low-cut filter that at least partially rejects wavelengths of light less than about 700 nm.

20. The infrared proximity sensor package of claim 18, wherein the lens is formed from a thermoset epoxy or a polymer.

21. The infrared proximity sensor package of claim 1, wherein at least one of a length and a width of the package is less than about 5 mm.

22. The infrared proximity sensor package of claim 1, wherein a height of the package is less than about 3 mm.

23. A method of making an infrared proximity sensor package, comprising:
providing an infrared transmitter;
providing an infrared receiver;
providing a shield disposed atop the package and having first and second apertures disposed therethrough and positioned over the infrared transmitter and the infrared receiver, respectively, such that infrared light emitted by the transmitter passes through the first aperture and infrared light reflected from an object to be detected passes through the second aperture for detection by the receiver, the shield comprising an infrared-absorbing material disposed on at least a top surface thereof;
providing a housing comprising sidewalls, a first recess positioned underneath the first aperture of the shield, a second recess positioned underneath the second aperture of the shield, and a partitioning divider disposed between the first and second recesses, the partitioning divider comprising a first portion and second portion, the first portion being of a first thickness and the second portion being of a second thickness different from the first thickness, the first portion substantially separating the transmitter and receiver;
positioning the transmitter within the first recess, and positioning the receiver within the second recess;
wherein the partitioning divider comprises liquid crystal polymer (LCP) such that the partitioning divider and the infrared-absorbing material of the shield cooperate together to substantially attenuate and absorb undesired infrared light that may otherwise become internally-reflected within the housing or incident upon the receiver as a false signal.

* * * * *